(12) United States Patent
Wolf (10) Patent No.: US 8,130,033 B2
(45) Date of Patent: Mar. 6, 2012

(54) SWITCHING LOW NOISE AMPLIFIER (75) Inventor: Randy L. Wolf, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 214 days.

(21) Appl. No.: 12/695,673

(22) Filed: Jan. 28, 2010

(65) Prior Publication Data
US 2010/0127783 A1 May 27, 2010

Related U.S. Application Data

(62) Division of application No. 11/744,993, filed on May 7, 2007, now abandoned.

(51) Int. Cl.
*H03F 1/14* (2006.01)
(52) U.S. Cl. ............ 330/51; 330/124 D; 330/124 R
(58) Field of Classification Search ............ 330/51, 330/124 R, 124 D
See application file for complete search history.

(56) References Cited

U.S. PATENT DOCUMENTS

| | | | | |
|---|---|---|---|---|
| 3,982,196 A | * | 9/1976 | Poujois | ............ 330/9 |
| 4,448,202 A | | 5/1984 | Wajszczuk et al. | |
| 4,453,130 A | * | 6/1984 | Bennett | ............ 330/51 |
| 4,780,685 A | * | 10/1988 | Ferguson | ............ 330/124 D |
| 6,046,640 A | | 4/2000 | Brunner | |
| 6,204,731 B1 | | 3/2001 | Jiang et al. | |
| 6,313,699 B1 | * | 11/2001 | Nishijima et al. | ............ 330/51 |
| 6,359,504 B1 | * | 3/2002 | Cozzarelli | ............ 330/51 |
| 6,392,492 B1 | | 5/2002 | Yuan | |
| 6,754,478 B1 | | 6/2004 | Lee et al. | |
| 6,930,546 B2 | | 8/2005 | Floyd | |
| 2004/0207471 A1 | | 10/2004 | Raja et al. | |
| 2006/0095872 A1 | | 5/2006 | McElvain et al. | |
| 2006/0097786 A1 | | 5/2006 | Su et al. | |
| 2006/0103468 A1 | | 5/2006 | Su et al. | |

* cited by examiner

*Primary Examiner* — Michael Shingleton
(74) *Attorney, Agent, or Firm* — Gibb I.P. Law Firm, LLC; David Cain, Esq.

(57) ABSTRACT

Disclosed are embodiments of an integrated circuit device, method and design structure for selectively amplifying one of multiple received input signals. The embodiments incorporate at least two first stage transistors and a single second stage transistor. The first stage transistors are adapted to receive input signals from the same or different input signal sources and are each electrically coupled to the second stage transistor. A control circuit design is adapted to individually turn on a selected first stage transistor in conjunction with the second stage transistor, thereby activating a corresponding one of the cascode amplifiers and allowing the input signal received by the selected first stage transistor to be separately amplified.

20 Claims, 5 Drawing Sheets

SWITCHING LOW NOISE AMPLIFIER

CROSS REFERENCE TO RELATED APPLICATION

This application is a Divisional Application of and claims priority to U.S. patent application Ser. No. 11/744,993 filed May 7, 2007 and assigned to the present Assignee, which is a Continuation-In-Part Application of U.S. patent application Ser. No. 11/555,275 filed on Nov. 3, 2006 and also assigned to the present Assignee.

BACKGROUND

1. Field of the Invention

The embodiments of the invention generally relate to low noise amplifiers for receiver circuits, and, more particularly, to a low noise amplifier capable of accommodating multiple input signals.

2. Description of the Related Art

Cellular phone manufactures often need to accommodate several different cellular standards (i.e., several different frequency bands). The different cellular standards are typically within the 800 MHz to 900 MHz range and/or within the 1800 MHz to 1900 MHz range. Broadband wireless devices similarly may operate at several different standards (e.g., several different Worldwide Interoperability for Microwave Access (WiMax) standards). The different WiMax standards are typically within the 2 to 11 GHz range and currently the focus is on 2.5 GHz, 3.5 GHz and 5.8 GHz.

Systems (e.g., cellular or broadband wireless communication devices, test applications, radiometers, etc.) that accommodate multiple frequencies, antennas and/or calibrated noise sources generally will have a receiver circuit with multiple front ends. Each front end of the receiver circuit incorporates a switch that provides a connection between a specific device antenna or noise source and a corresponding low noise amplifier (LNA). Each low noise amplifier is tuned to a desired frequency for noise figure and gain in order to amplify weak signals emanating from that antenna or noise source. The frequency can be the same or different for each low noise amplifier. For example, cellular or broadband wireless communication device, having a single antenna, can incorporate multiple LNAs to allow for operation at multiple different frequencies. Alternatively, a radar application can be connected to multiple antennas via multiple LNAs that operate at the same or different frequencies. The different front end switches allow the receiver circuit to switch between different LNA inputs.

However, a number of problems are associated with incorporating multiple front ends (i.e., switches to corresponding LNAs) into a receiver circuit. First, the multiple switches have loss, thereby adding to the overall noise figure of the receiver circuit. Second, the multiple switches and corresponding LNAs require additional space as well as additional power supplies and control circuitries to turn them on and off. Finally, additional switches are required at the output of each LNA and these additional switches similarly require additional space and control circuitry.

SUMMARY

In view of the foregoing, disclosed herein are embodiments of an integrated circuit device, method and design structure for selectively amplifying one of multiple received input signals. The embodiments incorporate multiple first stage transistors and a single second stage transistor. The first stage transistors are adapted to receive input signals from the same or different input signal sources and are each electrically coupled to a single second stage transistor, thereby forming multiple cascode amplifiers having a common second stage transistor within the same device. Each of these cascode amplifiers can be tuned to the same or different frequencies for noise figure and gain. Furthermore, a control circuit is adapted to selectively and individually turn on a selected one of the first stage transistors in conjunction with the second stage transistor, thereby activating a corresponding one of the cascode amplifiers and allowing the input signal received by the selected first stage transistor to be separately amplified.

More particularly, the embodiments of the integrated circuit device comprise a first stage and a second stage. The first stage comprises at least two transistors (i.e., first transistors) and the second stage comprises a single transistor (i.e., a second transistor). The transistors are all of a type suitable to be used for gain (e.g., bipolar transistors, field effect transistors (FETs), high electron mobility transistors (HEMTs), nanotube transistors, etc.). Additionally, each of the transistors comprises a control node (e.g., a base of a bipolar transistor, a gate of a FET, a gate of a nanotube transistor, etc.) and two additional nodes (e.g., a collector and emitter of a bipolar transistor, a source and drain of a FET, a source and drain of a nanotube transistor, etc.).

All of the first transistors in the first stage are electrically coupled to the second transistor in the second stage. Specifically, a selected additional node from the second transistor is electrically coupled to a selected additional node from each of the first transistors. For example, if the device comprises all bipolar transistors, then the emitter of the second bipolar transistor in the second stage is electrically coupled to the collector of each first bipolar transistor in the first stage. Similarly, if the device comprises all n-type field effect transistors, then the source of the second field effect transistor in the second stage is electrically coupled to the drain of each first field effect transistor in the first stage and vice versa if the device comprises all p-type field effect transistors. Buy coupling each of the first transistors to the second transistor in this manner, multiple cascode amplifiers having a common second stage transistor are formed within the same device. Each of the cascode amplifiers (i.e., each combination of a first and second transistor) can be tuned to the same or different frequencies for noise figure and gain.

The first transistors in the first stage are adapted to receive input signals from the same or different input signal sources. Each first transistor is further adapted to amplify an input signal and to transmit that input signal, once amplified, to the second transistor in the second stage. The second transistor is adapted to further amplify the input signal.

A control circuit is electrically coupled to the second transistor and to each of the first transistors. The control circuit is adapted to selectively and individually turn on the first control nodes from any one of the first transistors simultaneously with the second control node of the second transistor such that only one input signal is amplified by the device at a time. For example, for a device comprising bipolar transistors, the control circuit can be adapted to selectively turn on the first base for any one of the first bipolar transistors in the first stage simultaneously with the second base for the second bipolar transistor in the second stage. Similarly, for a device comprising field effect transistors, the control circuit can be adapted to selectively turn on the first gate for any one of the first field effect transistor in the first stage simultaneously with the second gate for the second field effect transistor in the second stage. By turning on the control node of a selected first transistor and the control node of the second transistor simultaneously, a low noise cascode amplifier is activated for separately amplifying the input signal that is received by that one selected first transistor.

Furthermore, by allowing any of the first transistors to be selectively and individually turned on in conjunction with the second transistor, the cascode amplifiers can alternatively be activated on demand. To accomplish this, the control circuit is electrically coupled to the control nodes of each of the first transistors and to the control node of the second transistor. This control circuit is adapted to turn on the second control node of the second transistor and to selectively and individually turn on the first control node of each first transistor in response to different predetermined voltages. The control circuit is further adapted to short to ground all other input signals not being processed.

The embodiments of the integrated circuit device, described above, provide for impedance matching through a plurality of first impedance matching circuits at the front end of the device and a second impedance matching circuit at the back end of the device. Specifically, a separate first impedance matching circuit is electrically coupled between the control node of each of the first transistors (e.g., between the base or gate of a first bipolar or field effect transistor, respectively) and its corresponding input signal source. Additionally, a single second impedance matching circuit is electrically coupled to the output of the second transistor (e.g., at the collector or drain of a second bipolar or field effect transistor, respectively).

Also disclosed herein are embodiments of a method of amplifying multiple input signals received by the same device. The embodiments comprise providing a two stage integrated circuit device, as described above, in which a first stage of the device comprises a plurality of first transistors and a second stage of the device comprises a second transistor electrically coupled to each of the first transistors, thereby forming multiple cascode amplifiers within the same device. Each of the different cascode amplifiers can be tuned to the same or different frequencies for noise figure and gain.

Input signals are generated by one or more input signal sources and transmitted to (i.e., received by) the first transistors. Impedance matching between the input signal source(s) and the first transistors can be accomplished by transmitting each input signal to each of the first transmitters via a separate corresponding impedance matching circuit.

Then, a first control node of any one of the first transistors is selectively and individually turned on (e.g., by a control circuit in response to a predetermined voltage), as is the second control node in the second transistor. As the first control node is selectively and individually turned on, the input signals that are transmitted to all of the other first transistors are shorted to ground. By turning on the control node of a selected first transistor and the control node of the second transistor simultaneously and by shorting the other input signals to ground, a low noise cascode amplifier is activated for separately amplifying the input signal that is received by that one selected first transistor.

The processes of selectively and individually turning on the first control node of a first transistor and simultaneously turning on the second control node of the second transistor can be repeated for each of the first transistors in order to allow different cascode amplifiers (i.e., different combinations of first and second transistors) to be activated on demand. This can be accomplished, for example, by a control circuit that turns on the first control nodes in response to different predetermined voltages.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, systems (e.g., cellular or broadband wireless communication devices, test applications, radiometers, etc.) that accommodate multiple frequencies, antennas and/or calibrated noise sources generally will have a receiver circuit with multiple front ends. Each front end of the receiver circuit incorporates a switch that provides a connection between a specific device antenna or noise source and a corresponding low noise amplifier (LNA). Each low noise amplifier is tuned to a desired frequency for noise figure and gain in order to amplify weak signals emanating from that antenna or noise source. The frequency can be the same or different for each low noise amplifier. For example, cellular or broadband wireless communication device, having a single antenna, can incorporate multiple LNAs to allow for operation at multiple different frequencies. Alternatively, a radar application can be connected to multiple antennas via multiple LNAs that operate at the same or different frequencies. The different front end switches allow the receiver circuit to switch between different LNA inputs.

However, a number of problems are associated with incorporating multiple front ends (i.e., switches to corresponding LNAs) into a receiver circuit. First, the multiple switches have loss, thereby adding to the overall noise figure of the receiver circuit. Second, the multiple switches and corresponding LNAs require additional space as well as additional power supplies and control circuitries to turn them on and off. Finally, additional switches are required at the output of each LNA and these additional switches similarly require additional space and control circuitry. Therefore, there is a need in the art for a low noise amplifier that is adapted to switch between multiple inputs signals.

In view of the foregoing, disclosed herein are embodiments of a single on-chip low noise amplifier that is adapted to efficiently switch between multiple inputs signals, operating at the same or differing radio frequencies (RF), such that the signal to noise ratio (SNR) is maximized prior to each input signal being amplified. The "switchable" low noise amplifier is designed as a two stage amplifier (i.e., two stage gain block) in which the first stage is capable of switching between two or more different inputs.

Figure 1:
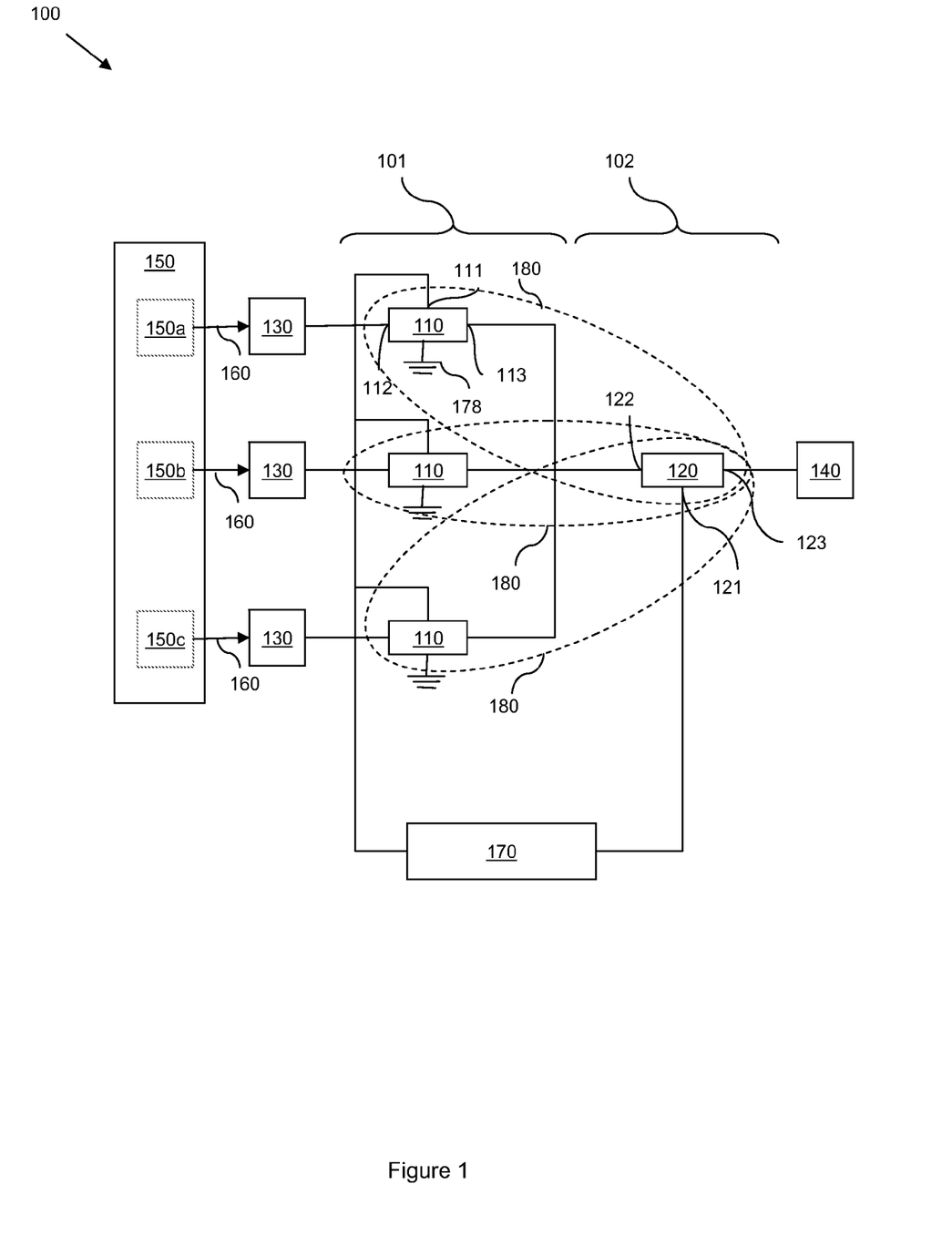
FIG. 1 is a block diagram illustrating embodiments of the integrated circuit device of the invention.

More specifically, referring to FIG. 1, disclosed herein are embodiments of a two stage integrated circuit device 100 that incorporates at least two first stage transistors 110 and a single second stage transistor 120. The first stage transistors 110 are adapted to receive input signals 160 from the same input signal source 150 or different input signal sources 150a-c and are each electrically coupled to the single second stage transistor 120. By coupling each first transistor 110 to the second transistor 120, multiple cascode amplifiers 180 having a common second stage transistor 120 are formed within the same device 100. Each of these cascode amplifiers 180 can be tuned to the same or different frequencies for noise figure and gain. Furthermore, a control circuit 170 allows the first stage transistors 110 to be selectively and individually turned on in conjunction with the second stage transistor 120 so any one of the multiple cascode amplifiers 180 can be activated on demand in order to separately amplify the input signal 160 received by a selected first stage transistor 110.

More particularly, the first stage 101 of the device 100 comprises at least two transistors 110 (i.e., first transistors) and the second stage 102 of the device 100 comprises a single transistor 120 (i.e., a second transistor). The transistors 110, 120 are all of a type suitable to be used for gain (e.g., bipolar transistors, field effect transistors (FETs), high electron mobility transistors (HEMTs), nanotube transistors, etc.). Additionally, each of the first transistors 110 comprises a first control node 111 and two first additional nodes 112-113. Similarly, the second transistor comprises a second control node 121 and two second additional nodes 122-123. For example, if the first and second transistors comprise bipolar transistors, then the control node of each transistor is a base region and the additional nodes are the collector and emitter regions. Similarly, if the first and second transistors comprise field effect transistors, then the control node of each transistor is a gate and the additional nodes are the source/drain regions.

All of the first transistors 110 in the first stage 101 are electrically coupled to the second transistor 120 in the second stage 102. By coupling the first transistors 110 to the second transistor 120, multiple cascode amplifiers 180 each having a common second stage transistor 120 are formed within the same device 100. Specifically, a selected additional node 122 from the second transistor 120 is electrically coupled to a selected additional node 113 from each of the first transistors 110. For example, if the first and second stages 101-102 of the device 100 comprise bipolar transistors, then the emitter of the second bipolar transistor in the second stage is electrically coupled to the collector of each first bipolar transistor in the first stage. Similarly, if the first and second stages 101-102 of the device 100 comprise n-type field effect transistors, then the source of the second field effect transistor in the second stage is electrically coupled to the drain of each first field effect transistor in the first stage and vice versa if the first and second stages comprise p-type field effect transistors.

Each of the first transistors 110 in the first stage 101 is adapted to receive an input signal 160. The input signal 160 that is received by the different first transistors 110 within the first stage 101 can be transmitted from the same input signal source 150 or multiple different input signal sources 150a-c. For example, each first transistor 110 can be electrically coupled to and receive the same input signal from the same antenna or noise source. Alternatively, each first transistor 110 can be electrically coupled to and receive different input signals from different antennas and/or other noise sources. Each first transistor 110 is further adapted to amplify the received input signal 160 and to then transmit that input signal 160 to the second transistor 120 in the second stage 102. The second transistor 120 is adapted to further amplify the input signal 160.

A control circuit 170 is electrically coupled to the second transistor 120 and to each of the first transistors 110 (e.g., via a plurality of additional transistors). This control circuit 170 is adapted to selectively and individually turn on the first control nodes 111 from any one of the first transistors 110 in the first stage 101 simultaneously with the second control node 121 of the second transistor 120 in the second stage 102 such that only one input signal 160 is amplified by the device 100 at a time. For example, for a device 100 comprising bipolar transistors, the control circuit 170 can be adapted to selectively turn on the first base for any one of the first bipolar transistors in the first stage simultaneously with the second base for the second bipolar transistor in the second stage. Similarly, for a device 100 comprising field effect transistors, the control circuit 170 can be adapted to selectively turn on the first gate for any one of the first field effect transistor in the first stage simultaneously with the second gate for the second field effect transistor in the second stage. By turning on the control nodes 111 of a selected first transistor 110 and a second transistor 120 simultaneously, a corresponding low noise cascode amplifier 180 is activated for separately amplifying the input signal 160 that is received by that one selected first transistor 110.

Furthermore, by allowing any one of the first transistors 110 to be selectively and individually turned on in conjunction with the second transistor 120, the various cascode amplifiers 180 can alternatively be activated on demand. Thus, only one input signal 160 will flow through any one cascode amplifier 180 (i.e., through a selected first transistor and then through a second transistor) within the device 100 at a time. To accomplish this, the control circuit 170 is electrically coupled to the control nodes 111 of each of the first transistors 110 and to the control node 121 of the second transistor 120 (e.g., via a series of additional transistors). This control circuit 170 is adapted to turn on the second control node 121 of the second transistor 120 and to individually turn on the first control nodes 111 of the first transistors 110 in response to different predetermined voltages. For example, in response to 0 volts the control circuit may turn on the control node of one first transistor and in response to 2.5 volts the control circuit may turn on the control node of a different first transistors (see detail discussion below regarding FIG. 2). The control circuit 170 is further adapted to short to ground 178 all other input signals 160 not being processed. Shorting to ground all other input signals increase the isolation between those input signals not being processed and the output of the device 100.

As mentioned above, each of the different cascode amplifiers 180 having a common second stage transistors 120 within the device 100 (i.e., each combination of a first and second transistor) can be tuned to the same or different frequencies for noise figure and gain. For example, in cellular or broadband wireless communication applications the input signal 160 to each of the first transistors 110 can be from the same input signal source 150 (e.g., from the same antenna). However, in such applications the specified frequencies, at which each individual first transistor in series with the second transistor is tuned, can be different. Thus, cellular devices can accommodate multiple standards which consist of several frequency bands, for example, within the 800 MHz to 900 MHz and the 1800 MHz to 1900 MHz ranges. Similarly, broadband wireless devices may accommodate multiple Worldwide Interoperability for Microwave Access (WiMax) standards, which consist of several frequency bands that are typically within the 2 to 11 GHz range (e.g., 2.5 GHz, 3.5 GHz and/or 5.8 GHz). Alternatively, in other types of applications, such as radar or test applications, the input signal 160 to each of the first transistors 110 can be from different input signal sources 150*a-c* (e.g., from different antennas or calibrated noise sources). In such applications, the specified frequencies, at which each individual first transistor 110 in series with the second transistor 120 is tuned, can be either the same or different, depending upon system objectives.

The embodiments of the integrated circuit device 100, described above, provide for impedance matching through a plurality of first impedance matching circuits 130 at the front end of the device 100 and a second impedance matching circuit 140 at the back end of the device 100. Specifically, a separate first impedance matching circuit 130 is electrically coupled between the control node 111 of each of the first transistors 110 (e.g., between the base or gate of a first bipolar or field effect transistor, respectively) and its corresponding input signal source 150 or 150*a-c*. Additionally, a single second impedance matching circuit 140 is electrically coupled to the output node 123 of the second transistor 120 (e.g., at the collector or drain of a second bipolar or field effect transistor, respectively). The impedance matching circuits 130 and 140 can comprise conventional matching networks, transformers, etc., that are formed using conventional impedance matching techniques.

Figure 2:
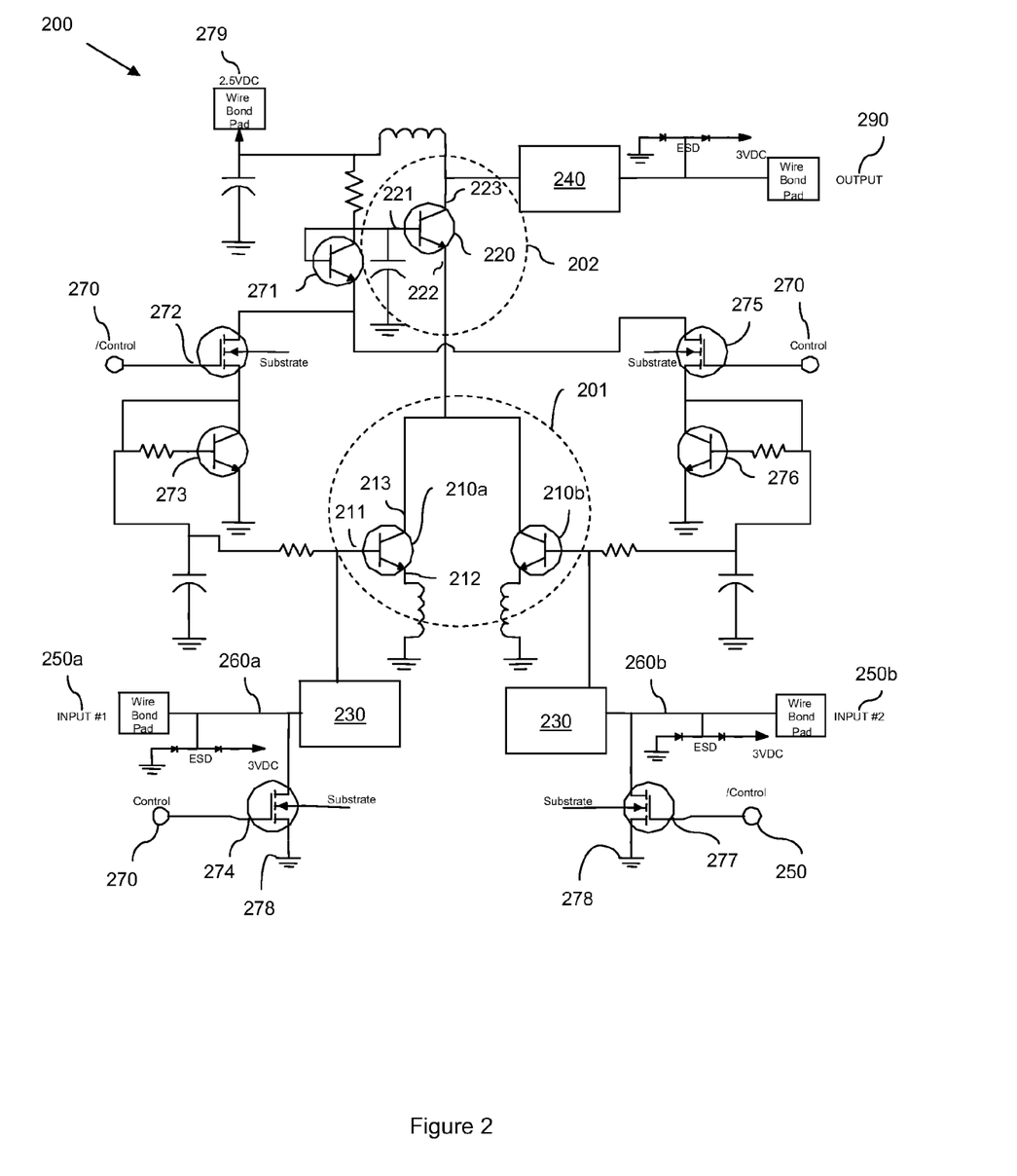
FIG. 2 is a schematic diagram illustrating an embodiment of the integrated circuit device of the invention.

FIG. 2 is a schematic diagram illustrating an exemplary device 200 according to the present invention. For illustration purposes, the transistors depicted in FIG. 2 are bipolar transistors and is optimized for 20 GHz. However, as mentioned above, it is anticipated that any transistor that can be used for gain (e.g., bipolar transistors, field effect transistors, high electron mobility transistors, etc.) may be incorporated into the device 200. Additionally, while only two first stage transistors 210*a-b* are illustrated, as mentioned above, it is anticipated that embodiments of the invention may be practiced with more than two first stage transistors.

The integrated circuit device 200, as illustrated, comprises the three ports: two input ports through which input signals 260*a-b* are received from one or more input signal sources 250*a-b* (i.e., from the same or different antennas and/or noise sources) and an output port 290. An on-chip complementary metal oxide semiconductor (CMOS) control circuit 270 is electrically coupled to the base 211 of each first transistor 210*a-b* and to the base 221 of the second transistor 220 via a plurality of additional transistors 271-277.

A voltage 279 (e.g., a 2.5VDC voltage) is supplied to the bipolar transistors. The expected current draw is 14 mA. The current flows from the top half of the device 200 down to either the left half or the right half, depending upon the voltage biasing the gates of the n-channel metal oxide semiconductor (NMOS) field effect transistors 272 and 275, in order to selectively turn on the control node 211 of either first transistor 210*a* or first transistor 210*b*. The biasing of the gates of transistors 272 and 275 is complementary and is provided by the control circuit 270, for example, as illustrated in FIG. 3.

Figure 3:
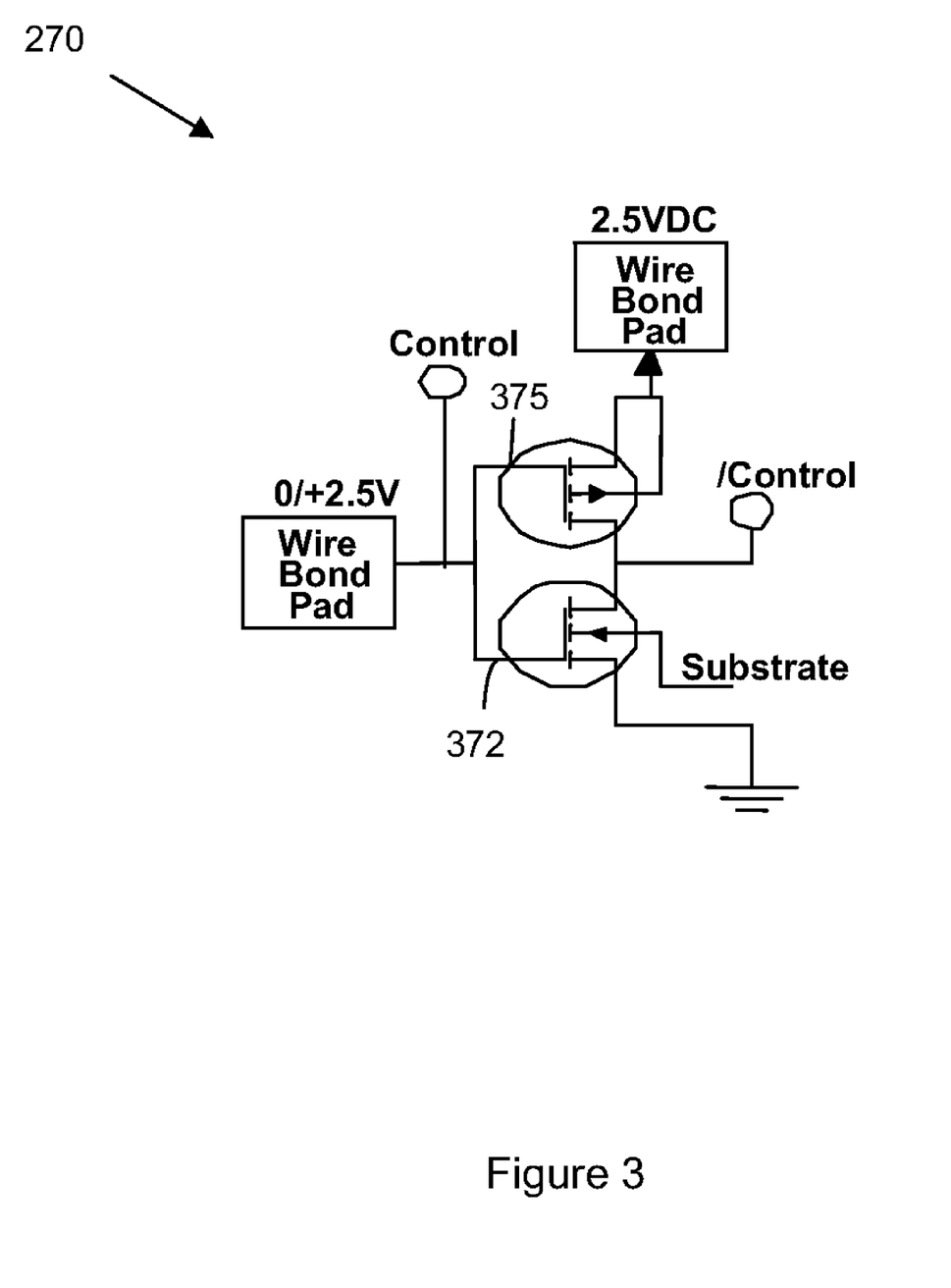
FIG. 3 is a schematic diagram of a control circuit.

Specifically, the biasing of the gates of transistors 272 and 275 can depend upon predetermined voltages supplied to the gates of transistors 372 and 375 of FIG. 3. For example, if 0 volts is supplied to the gates of the transistors 372 and 375 of FIG. 3, then "/Control" is high, turning on transistor 272. This allows current to flow from transistor 271 through transistors 272 and 273, thus biasing RF transistor 210*a* in the first stage 201 and RF transistor 220 in the second stage 202. By biasing transistor 210*a* and transistor 220 simultaneously a path is provided for signal 260*a* on input #1 250*a* to be amplified by transistor 210*a* in a common emitter configuration and then by transistor 220 in a common base configuration (i.e., a cascode amplifier is formed on demand). In addition, transistor 277 is turned on to increase isolation between the "off" input #2 250*b* and the output 290 by shorting the input signal 260*b* to ground 278. Contrarily, if 2.5 volts is supplied to the gates of transistors 372, 375 of FIG. 3, then "/Control" is low shutting off transistor 272 and turning on transistor 275 of FIG. 2. This allows current to flow from transistor 271 through transistors 275 and 276, thus biasing RF transistor 210*b* in the first stage 201 and RF transistor 220 in the second stage 202. By biasing transistor 210*b* and transistor 220 simultaneously a path is provided for signal 260*b* on input #2 250*b* to be amplified by transistor 210*b* in a common emitter configuration and then by transistor 220 in a common base configuration (i.e., a different cascode amplifier is formed on demand). In addition, transistor 274 is turned on to increase isolation between the "off" input #1 250*a* and the output 290 by shorting the input signal 260*a* to ground 278. A high degree of tracking is accomplished because both sides of the "switch" are fabricated on one chip.

Figure 4:
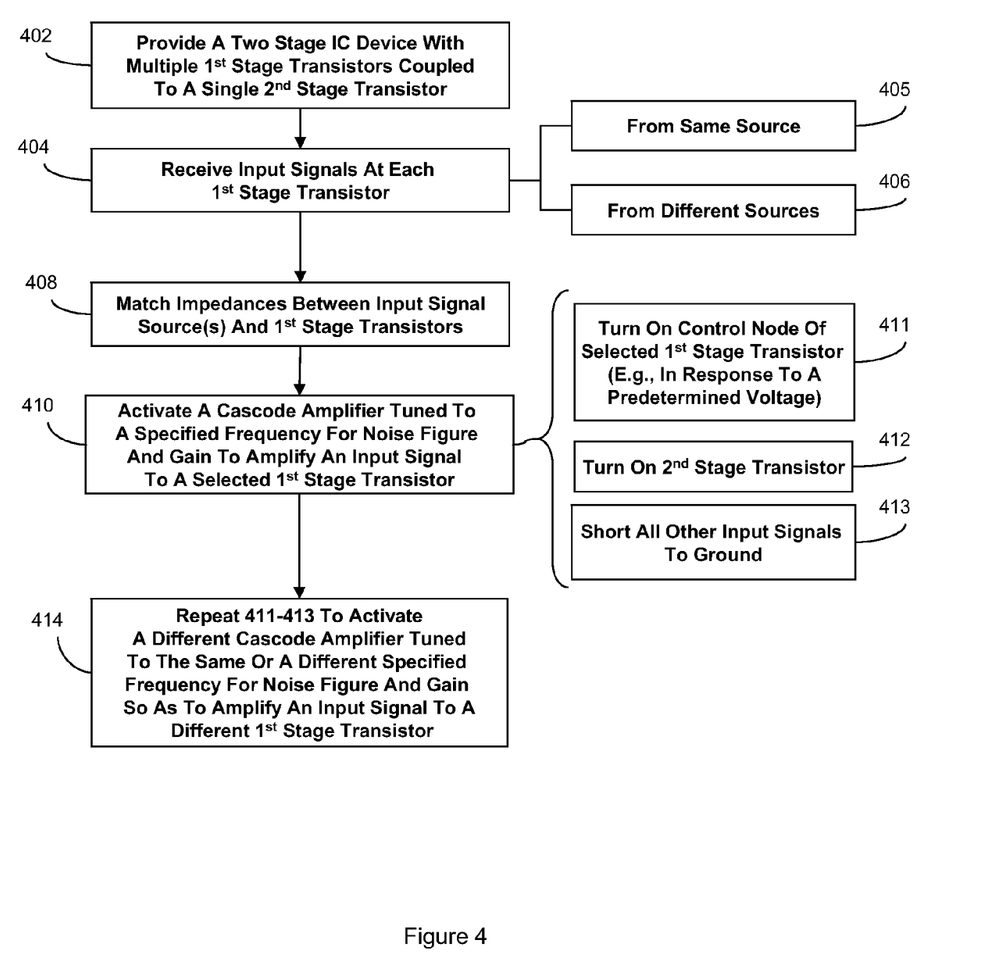
FIG. 4 is a flow diagram illustrating an embodiment of a method of the invention.

Referring to FIG. 4, also disclosed herein are embodiments of a method of amplifying multiple input signals. The embodiments comprise providing a two stage integrated circuit device 100, as described above and illustrated in FIG. 1, in which a first stage 101 of the device 100 comprises a plurality of first transistors 110 and a second stage 102 of the device 100 comprises a second transistor 120 electrically coupled to each of the first transistors 110, thereby forming multiple cascode amplifiers 180 (402).

Input signals 160 are generated by one or more input signal sources (e.g., one or more antennas and/or calibrated noise sources) and transmitted to (i.e., received by) the first transistors 110 (404). For example, in cellular or broadband wireless communication applications the input signal 160 received by each of the first transistors 110 can be transmitted from the same input signal source 150 (e.g., from the same antenna) that is electrically coupled to each of the first transistors 110 (405). Alternatively, in other types of applications, such as radar or test applications, the input signal 160 received by each of the first transistors 110 can be transmitted from different input signal sources 150*a-c* (e.g., from different antennas or calibrated noise sources) that are each electrically coupled to a different corresponding first transistor 110 (406).

Impedance matching between the input signal source(s) 150 and the first transistors 110 can be accomplished by transmitting each input signal 160 to each of the first transmitters 110 via a separate corresponding impedance matching circuit 130 (408).

Then, a cascode amplifier 180 that is tuned to a specified frequency for noise figure and gain is activated to separately amplify the input signal that is received by a selected one of the first transistors 110 (410). Specifically, a first control node 111 of a specific one of the first transistors 110 is selectively and individually turned on (e.g., by a control circuit in response to a predetermined voltage), as is the second control node 121 in the second transistor 120 (e.g., the base of a second bipolar transistor or the gate of a second field effect transistor) (411-412). As the first control node 111 is selectively and individually turned on, the input signals 160 that are transmitted to all of the other first transistors 110 are shorted to ground 178 (413). By turning on the control nodes 111, 121 of a specific one of the first transistors 110 and of the second transistor 120 simultaneously and by shorting the other input signals to ground at process 411-413, a low noise cascode amplifier 180 is activated for separately amplifying the input signal that is received by that one selected first transistor 110.

The processes 411-413 of selectively and individually turning on the first control node 111 of a first transistor 110 and simultaneously turning on the second control node 121 of the second transistor 120 can be repeated for any other first transistor 110 in order to allow different cascode amplifiers (i.e., different combinations of first and second transistors) to be activated and, thereby to separately amply the input signals received by different first stage transistors (414). This can be accomplished, for example, by a control circuit 170 that turns on different first control nodes 111 in response to different predetermined voltages.

The cascode amplifiers 180 that are activated at processes 410 and 414 can be tuned to the same or different frequencies for noise figure and gain. For example, in cellular or broadband wireless communication applications the input signal to each of the first transistors can be from the same input signal source (e.g., from the same antenna). However, in such applications the specified frequencies, at which each individual first transistor in series with the second transistor is tuned, can be different. Alternatively, in other types of applications, such as radar or test applications, the input signal to each of the first transistors can be from different input signal sources (e.g., from different antennas or calibrated noise sources). In such applications, the specified frequencies, at which each individual first transistor in series with the second transistor is tuned, can be either the same or different, depending upon system objectives.

Therefore, disclosed above are embodiments of a two stage integrated circuit device adapted to selectively amplify one of multiple received input signals and an associated method. Specifically, the integrated circuit device incorporates at least two first stage transistors and a single second stage transistor. The first stage transistors are adapted to receive input signals from the same or different input signal sources and are each electrically coupled to the single second stage transistor, thereby forming multiple cascode amplifiers each having a common second stage transistor. Each of these cascode amplifiers can be tuned to the same or different frequencies for noise figure and gain. Furthermore, a control circuit is adapted to selectively and individually turn on a selected one of the first stage transistors in conjunction with the second stage transistor, thereby activating a corresponding one of the cascode amplifiers and allowing the input signal received by the selected first stage transistor to be separately amplified. These embodiments eliminate the loss of the switch or coupler as well as the need for multiple low noise amplifiers. Additionally, the device lowers the overall receiver noise figure by eliminating the loss of the switch in the front end. Those skilled in the art will recognize that the amount of reduction depends on the frequency of operation and can, for example, be between 0.5 to 1 dB.

Figure 5:
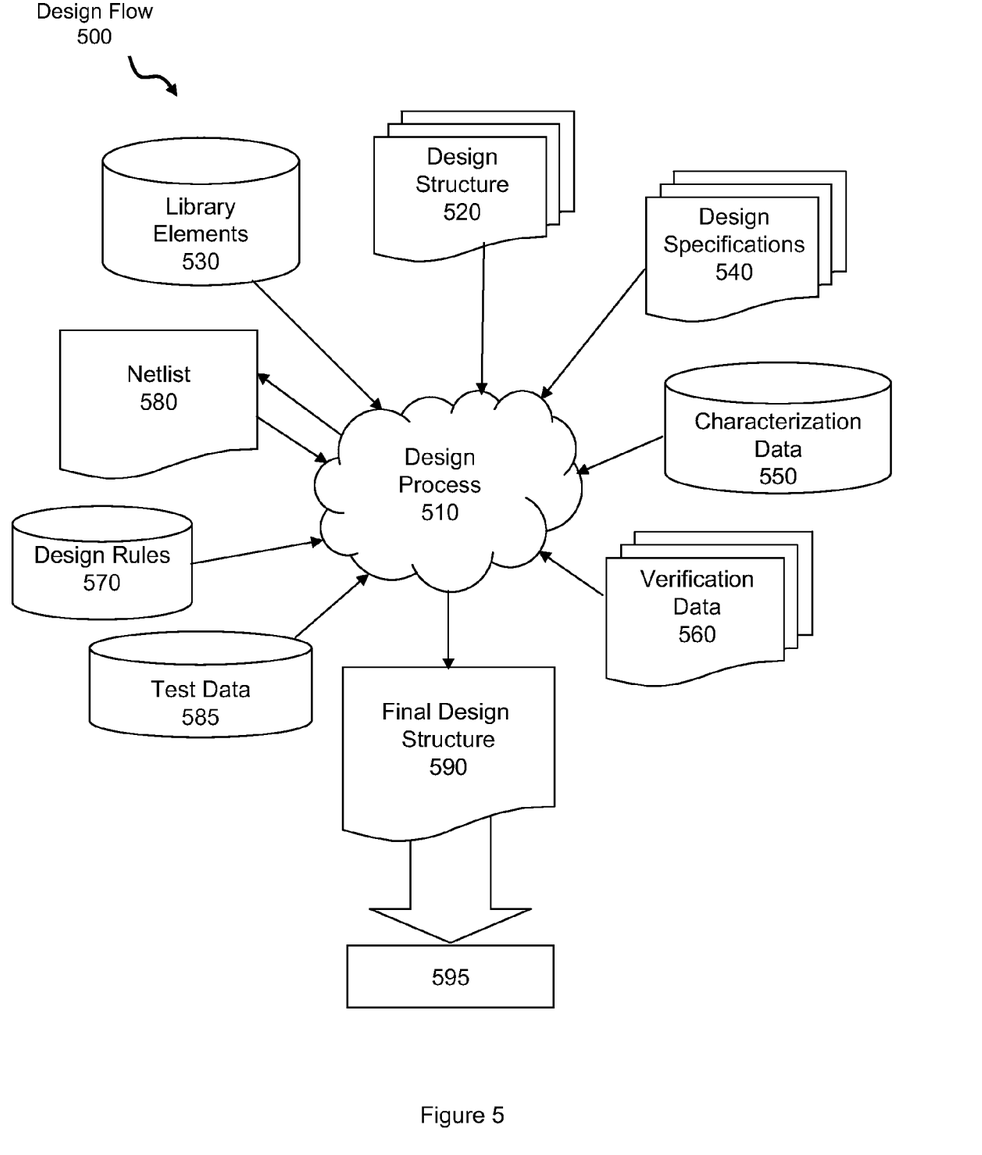
FIG. 5 is a an example design flow process of instantiating a design structure comprising the integrated circuit device of the present invention into an IC design to create a final design structure.

FIG. 5 shows a block diagram of an example design flow 500. Design flow 500 may vary depending on the type of IC being designed. For example, a design flow 500 for building an application specific IC (ASIC) will differ from a design flow 500 for designing a standard component. Design structure 520 is an input to a design process 510 and may come from an IP provider, a core developer, or other design company. Design structure 520 comprises integrated circuit device 200 in the form of schematics or HDL, a hardware-description language, (e.g., Verilog, VHDL, C, etc.). Design structure 520 may be on one or more of machine readable medium, for example, an electronic file on a hard drive or a CD ROM. Design structure 520 may, for example, be a text file or a graphical representation of integrated circuit device 200. Design process 510 synthesizes (or translates) integrated circuit device 200 into a netlist 580, where netlist 580 is, for example, a list of I/O, library modules, wires, transistors, etc. and describes the connections to other elements and circuits in an integrated circuit design and recorded on at least one of machine readable medium.

Design process 510 includes using a variety of inputs; for example, inputs from library elements 530 which may house a set of commonly used elements, circuits, and devices, including models, layouts, and symbolic representations, for a given manufacturing technology (e.g. different technology nodes, 32 nm, 45 nm, 90 nm, etc.), design specifications 540, characterization data 550, verification data 560, design rules 570, and test data files 585, which may include test patterns and other testing information. Design process 510 further includes, for example, standard circuit design processes such as timing analysis, verification tools, design rule checkers, place and route tools, etc. One of ordinary skill in the art of integrated circuit design can appreciate the extent of possible electronic design automation tools and applications used in design process 510 without deviating from the scope and spirit of the invention.

Ultimately design process 510 translates integrated circuit device 200, along with the rest of the integrated circuit design (if applicable), into a final design structure 590 (e.g., information stored in a GDS storage medium). Final design structure 590 may comprise information such as, for example, test data files, design content files, manufacturing data, layout parameters, wires, levels of metal, vias, shapes, test data, data for routing through the manufacturing line, and any other data required by a semiconductor manufacturer to produce integrated circuit device 200. Final design structure 590 may then proceed to a stage 595 of design flow 500; where stage 595 is, for example, where final design structure 590: proceeds to tape-out, is released to manufacturing, is sent to another design house or is sent back to the customer.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. An integrated circuit device for selectively amplifying only one of multiple input signals at a time, said integrated circuit device comprising:
a plurality of first transistors comprising corresponding first control nodes, each of said first transistors receiving a corresponding one of said multiple input signals;
a second transistor electrically coupled in series to each of said first transistors and comprising a second control node; and
a control circuit electrically coupled to said first control nodes of each of said first transistors and to said second control node of said second transistor, said control circuit selectively and individually turning on a first control node of only a selected one of said first transistors so as to process said only one of said multiple input signals and transmit said only one of said multiple input signals to said second transistor and, during said turning on of said selected one of said first transistors, further shorting all others of said first transistors to ground and simultaneously turning on said second control node of said second transistor such that only said selected one of said first transistors amplifies a received input signal and then transmits said received input signal to said second transistor for further amplification,
wherein by selectively and individually turning on said first control node of only said selected one of said first transistors, while all others of said first transistors are shorted to ground, said control circuit selectively forms different cascode amplifiers, on demand.

2. The integrated circuit device of claim 1, further comprising:
a plurality of first impedance matching circuits, wherein each one of said first impedance matching circuits is electrically coupled between an input signal source and a corresponding one of said first transistors; and
a second impedance matching circuit electrically coupled to said second transistor.

3. The integrated circuit device of claim 1, said control circuit selectively and individually turning on said first control nodes in response to different predetermined voltages.

4. The integrated circuit device of claim 1, said different cascode amplifiers being tuned to specified frequencies for noise figure and gain.

5. The integrated circuit device of claim 4, wherein any one of the following conditions occur:
said multiple input signals received by said first transistors are transmitted from a single input signal source and said specified frequencies are different;
said multiple input signals received by said first transistors are transmitted from different input signal sources and said specified frequencies are the same; and
said multiple input signals received by said first transistors are transmitted from different input signal sources and said specified frequencies are different.

6. An integrated circuit device for selectively amplifying only one of multiple input signals at a time, said integrated circuit device comprising:
a plurality of first bipolar transistors comprising corresponding first bases, each of said first bipolar transistors receiving a corresponding one of said multiple input signals;
a second bipolar transistor electrically coupled in series to each of said first bipolar transistors and comprising a second base; and
a control circuit electrically coupled to said first bases of each of said first bipolar transistors and to said second base of said second bipolar transistor, said control circuit selectively and individually turning on a first base of only a selected one of said first bipolar transistors so as to process said only one of said multiple input signals and transmit said only one of said multiple input signals to said second bipolar transistor and, during said turning on of said selected one of said first bipolar transistors, further shorting all others of said first bipolar transistors to ground and simultaneously turning on said second base of said second bipolar transistor such that only said selected one of said first bipolar transistors amplifies a received input signal and then transmits said received input signal to said second bipolar transistor for further amplification,
wherein by selectively and individually turning on said first base of only said selected one of said first bipolar transistors, while all others of said first bipolar transistors are shorted to ground, said control circuit selectively forms different cascode amplifiers, on demand.

7. The integrated circuit device of claim 6, further comprising:
a plurality of first impedance matching circuits, wherein each one of said first impedance matching circuits is electrically coupled between an input signal source and a corresponding one of said first bipolar transistors; and
a second impedance matching circuit electrically coupled to said second bipolar transistor.

8. The integrated circuit device of claim 6, said control circuit selectively and individually turning on said first bases in response to different predetermined voltages.

9. The integrated circuit device of claim 6, said different cascode amplifiers being tuned to specified frequencies for noise figure and gain.

10. The integrated circuit device of claim 9, wherein any one of the following conditions occur:
said multiple input signals received by said first bipolar transistors are transmitted from a single input signal source and said specified frequencies are different;
said multiple input signals received by said first bipolar transistors are transmitted from different input signal sources and said specified frequencies are the same; and
said multiple input signals received by said first bipolar transistors are transmitted from different input signal sources and said specified frequencies are different.

11. An integrated circuit device for selectively amplifying only one of multiple input signals at a time, said integrated circuit device comprising:
a plurality of first field effect transistors comprising corresponding first gates, each of said first field effect transistors receiving a corresponding one of said multiple input signals;
a second field effect transistor electrically coupled in series to each of said first field effect transistors and comprising a second gate; and
a control circuit electrically coupled to said first gates of each of said first field effect transistors and to said second gate of said second field effect transistor, said control circuit selectively and individually turning on a first gate of only a selected one of said first field effect transistors so as to process said only one of said multiple input signals and transmit said only one of said multiple input signals to said second field effect transistor and, during said turning on of said selected one of said first field effect transistors, further shorting all others of said first field effect transistors to ground and simultaneously turning on said second gate of said second field effect transistor such that only said selected one of said first field effect transistors amplifies a received input signal and then transmits said received input signal to said second field effect transistor for further amplification, wherein by selectively and individually turning on said first gate of only said selected one of said first field effect transistors, while all others of said first field effect transistors are shorted to ground, said control circuit selectively forms different cascode amplifiers, on demand.

12. The integrated circuit device of claim 11, further comprising:

a plurality of first impedance matching circuits, wherein each one of said first impedance matching circuits is electrically coupled between an input signal source and a corresponding one of said first field effect transistors; and a second impedance matching circuit electrically coupled to said second field effect transistor.

13. The integrated circuit device of claim 11, said control circuit selectively and individually turning on said first gates in response to different predetermined voltages.

14. The integrated circuit device of claim 11, said different cascode amplifiers being tuned to specified frequencies for noise figure and gain.

15. The integrated circuit device of claim 11, wherein any one of the following conditions occur:

said multiple input signals received by said first field effect transistors are transmitted from a single input signal source and said specified frequencies are different;

said multiple input signals received by said first field effect transistors are transmitted from different input signal sources and said specified frequencies are the same; and said multiple input signals received by said first field effect transistors are transmitted from different input signal sources and said specified frequencies are different.

16. A method of amplifying multiple input signals, said method comprising:

providing an integrated circuit device comprising: a plurality of first transistors, having first control nodes; a second transistor electrically coupled in series to each of said first transistors and having a second control node; and a controller;

receiving, by said first transistors, multiple input signals;

selectively amplifying, by said integrated circuit device, only one of said multiple input signals at a time, said selectively amplifying comprising:

selectively and individually turning on, by said controller, a first control node of only one of said first transistors so as to process said only one of said multiple input signals and then transmit said only one of said multiple input signals to said second transistor;

during said turning on of said first control node of said only one first transistor, shorting, by said controller, all others of said first transistors to ground; and simultaneously turning on, by said controller, a second control node of said second transistor in order to further process said only one of said multiple input signals, wherein said selectively and individually turning on said first control node of said only one of said first transistors and said simultaneously turning on said second control node of said second transistor allow different cascode amplifiers to be selectively formed on demand, depending upon which of said first transistors is turned on.

17. The method of claim 16, further comprising matching impedances between input signal sources and said first transistors.

18. The method of claim 16, said selectively and individually turning on of said first control nodes being performed in response to different predetermined voltages.

19. The method of claim 16, further comprising tuning said different cascode amplifiers to specified frequencies for noise figure and gain.

20. The method of claim 19, further comprising any one of the following:

said receiving, by said first transistors, of said multiple input signals comprising receiving of said multiple input signals from a single input signal source and said tuning of said different cascode amplifiers comprising tuning said different cascode amplifiers such that said specified frequencies are different;

said receiving, by said first transistors, of said multiple input signals comprising receiving of said multiple input signals from different input signal sources and said tuning of said different cascode amplifiers comprising tuning said different cascode amplifiers such that said specified frequencies are the same; and said receiving, by said first transistors, of said multiple input signals comprising receiving of said multiple input signals from different input signal sources and said tuning of said different cascode amplifiers comprising tuning said different cascode amplifiers such that said specified frequencies are different.

* * * * *